United States Patent [19]

Koike

[11] Patent Number: 4,705,994
[45] Date of Patent: Nov. 10, 1987

[54] ELECTRIC EQUIPMENT DRIVING CIRCUIT

[75] Inventor: Eishi Koike, Sagamihara, Japan

[73] Assignee: Ozen Corporation, Tokyo, Japan

[21] Appl. No.: 937,681

[22] Filed: Dec. 4, 1986

[51] Int. Cl.⁴ ............................................. A63H 30/04
[52] U.S. Cl. ..................................... 318/16; 367/198; 446/454
[58] Field of Search .................. 318/16; 367/197, 198, 367/199; 446/397, 408, 454

[56] References Cited

U.S. PATENT DOCUMENTS 3,892,920  7/1975  Kolm ................................... 367/197
4,317,189  2/1982  Fukuoka ......................... 367/198 X

FOREIGN PATENT DOCUMENTS 3007137  9/1980  Fed. Rep. of Germany ........ 318/16

Primary Examiner—William M. Shoop, Jr.
Assistant Examiner—Bentsu Ro
Attorney, Agent, or Firm—Arnold S. Weintraub

[57] ABSTRACT

A microphone senses a sound generated by the user clapping his hands and converts the sound into an electric signal which is applied to a flip-flop circuit to set the latter. The output of the flip-flop circuit is supplied through a time constant circuit to a drive and control circuit for operating a sound generating device having a reproducing stylus and a recorded disk. A reset signal producing circuit is provided to produce a reset signal for the flip-flop circuit when a second sound is sensed by the microphone within a predetermined time period set by the time constant circuit, thereby stopping the operation of the sound generating device.

1 Claim, 4 Drawing Figures

ELECTRIC EQUIPMENT DRIVING CIRCUIT

BACKGROUND OF THE INVENTION

1. Field of the Invention:

The present invention relates to an electric equipment driving circuit, and in particular, to an electric equipment driving circuit suitable for driving an electric motor for toys, such as, for example, a voice generating device.

2. Description of the Prior Art:

A prior art electric equipment driving circuit is disclosed, for example, in Japanese Utility Model Laid-Open (Kokai) Publication No. 60-49894 (1985).

In this prior art example, the electric equipment driving circuit is designed to drive a voice generating device for a toy for a fixed time period by sensing a sound. For this purpose, a melody generating mechanism having a sound sensitive actuating switch is provided in a main body of the toy. The sound sensitive actuating switch includes in combination a microphone, an amplifier circuit, and a switching circuit for turning on the melody generating mechanism in response to a sound sense signal from the amplifier circuit. The melody generating mechanism is arranged to start the operation in response to an ON signal from the switching circuit and to stop the operation after a fixed time period elapses.

Since the prior art electric equipment driving circuit is designed to operate the melody generating mechanism for a fixed time period solely by sensing a sound, once the sound is sensed, the melody continues to be generated until the fixed time period elapses. This creates a problem in that the user cannot adjust the sounding time as he desires.

SUMMARY OF THE INVENTION

The present invention was made in view of the problem in the prior art. It is an object of the present invention to provide an electric equipment driving circuit capable of driving an electric motor for only as long as the operator desires by starting the electric motor upon detection of a first input signal, such as sound or light, and by stopping the electric motor upon detection of a next input signal.

In order to achieve the object, an electric equipment driving circuit according to the present invention is comprised of: a transducer for converting a sound or light signal into an electric signal; a bistable circuit which receives the output from the transducer as a set signal; a time constant circuit connected to the output terminal of the bistable circuit for producing an output after a fixed time elapses from the start of the output of the bistable circuit; a reset signal producing circuit which receives the output of the time constant circuit, the output of the bistable circuit, and the output of the transducer and produces a reset signal for the bistable circuit when the output of the time constant circuit is received, or when the output of the bistable circuit together with the output of the transducer are in an on condition; and a drive and control circuit which receives the output of the bistable circuit for driving and controlling an electric motor as long as the on condition of the bistable circuit continues.

In the present invention, a sound or light input signal is converted to an electric signal by the transducer, and the bistable circuit is brought into a set condition by the electric signal. Upon setting of the bistable circuit, the drive and control circuit is activated, and electric equipment, such as a sound generating device or the like, connected to the drive and control circuit is started and driven. At the same time, the time constant circuit is started. After a fixed time elapses, a reset signal is outputted from the reset signal producing circuit based on the output of the time constant circuit, and the driving of the electric equipment by the drive and control circuit is stopped.

If, when the bistable circuit is in the set condition, a sound or light signal is inputted to the transducer within the fixed time period set by the time constant circuit, a reset signal is produced based on the output from the transducer and the output of the bistable circuit. The driving of the electric motor by the drive and control circuit is stopped.

Accordingly, the instant invention has the advantage that the starting and stopping of, for example, a sound generating device can be repeated as desired by the user. In particular, when the present invention is used in the driving circuit of the sound generating device for toys, interesting sound generation can be provided.

DESCRIPTION OF THE PREFERRED EMBODIMENT

The embodiment of the present invention will be described with reference to the drawings.

Figure 1:
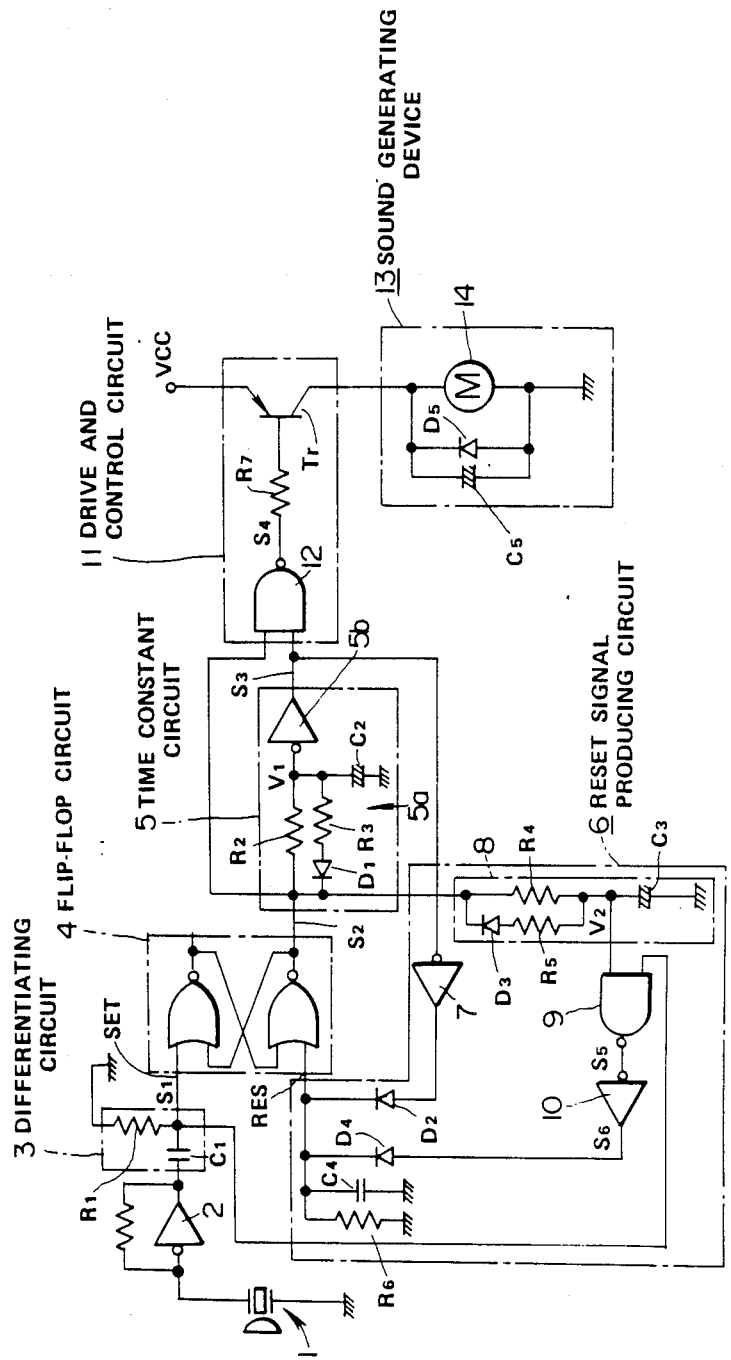
FIG. 1 is an electric circuit diagram illustrating an embodiment of the present invention.

In FIG. 1, the reference numeral 1 designates a microphone which acts as a transducer for converting an acoustic signal into an electric signal. The output of the microphone 1 is supplied to a set terminal Set of an RS type flip-flop circuit 4 as a bistable circuit through an inverter 2 and a differentiating circuit 3, including a capacitor $C_1$ and a resistor $R_1$.

The output of the flip-flop circuit 4 is supplied to a time constant circuit 5. The time constant circuit 5 is comprised of: a series circuit comprising a resistor $R_2$ and a capacitor $C_2$ connected between the output terminal of the flip-flop circuit 4 and ground; a charging and discharging circuit 5a including a series circuit of a diode $D_1$ and a resistor $R_3$ connected in parallel with the resistor $R_2$; and an inverter 5b supplied with a charged voltage of the capacitor $C_2$. Here, a time constant determined by a resistance value of the resistor $R_2$ and a capacity of the capacitor $C_2$ is selected to correspond to the reproducing time of a sound generating device 13 which will be described later. Typically, this value might be one minute.

The output of the time constant circuit 5, the output of the bistable circuit 4, and the differentiated output obtained by differentiating the output of the transducer 1 in the differentiating circuit 3 are supplied to a reset signal producing circuit 6. The reset signal producing circuit 6 is comprised of: a series circuit comprised of an inverter 7 and a diode $D_2$; a charging and discharging circuit 8, including a parallel circuit comprised of a resistor $R_4$, and a series circuit of a resistor $R_5$ and a diode $D_3$ connected in parallel with the resistor $R_4$; a capacitor $C_3$ connected in series to the parallel circuit; an NAND circuit 9; and a series circuit comprised of an inverter 10 and a diode 4 connected to the NAND circuit 9. In the reset signal producing circuit 6, the series circuit comprised of the inverter 7 and the diode $D_2$ is connected between the output terminal of the time constant circuit 5 and the reset terminal Res of the flip-flop circuit 4. The parallel circuit ($R_4$, $D_3$, and $R_5$) in the charging and discharging circuit 8 is connected between the output terminal of the flip-flop circuit 4 and one input terminal of the NAND circuit 9. Thus, one input terminal of the NAND circuit 9 is connected to the junction point between the parallel circuit and the capacitor $C_3$ in the charging and discharging circuit 8. The other input terminal of the NAND circuit 9 is connected to the output terminal of the differentiating circuit 3. The series circuit comprised of the inverter 10 and the diode $D_4$ is connected between the output of the NAND circuit 9 and the reset terminal Res of the flip-flop circuit 4. Thus, the cathodes of the diodes $D_2$ and $D_4$ are connected to the reset terminal Res of the flip-flop circuit 4. Further, a capacitor $C_4$ and a resistor $R_6$ are connected in parallel to each other between the junction point of the cathodes of the diodes $D_2$ and $D_4$ and ground.

Further, the output of the flip-flop circuit 4, and the output of the time constant circuit 5 are supplied to the drive and control circuit 11. The drive and control circuit 11 is comprised of an NAND circuit 12 having input terminals respectively supplied with the outputs from the flip-flop circuit 4 and the time constant circuit 5, and a PNP type transistor Tr having the base connected to the output terminal of the NAND circuit 12 through a resistor $R_7$. The emitter of the transistor Tr is connected to a positive power suply Vcc, and the collector is connected to ground through a driving motor 14 of a sound generating device 13. In the sound generating device 13, a diode 5 is a surge voltage absorbing diode for the driving motor 14, and a capacitor $C_5$ is a noise absorbing capacitor.

Figure 2:
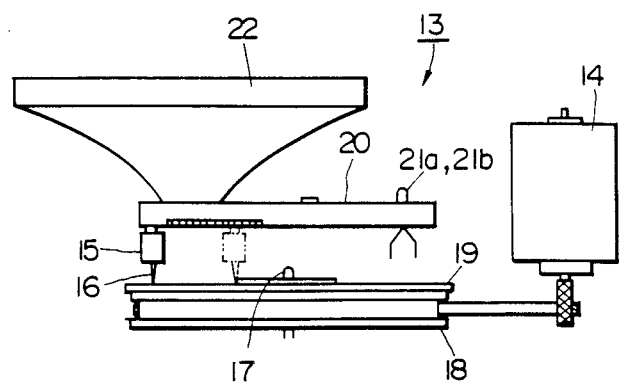
FIG. 2 is a front view of a sound generating device to which the present invention is applicable.
Figure 3:
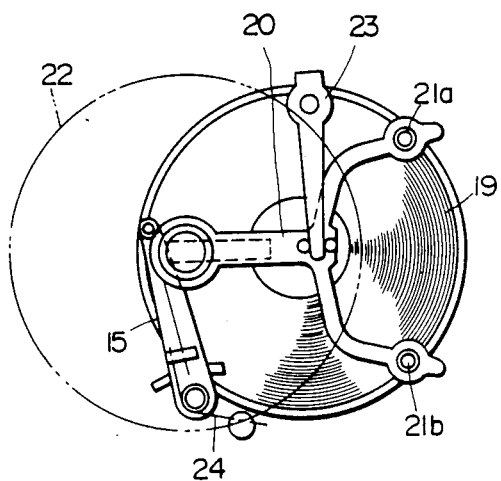
FIG. 3 is a plan view of the sound transfer body in FIG. 2.

An example of the sound generating device 13 is arranged as shown in FIGS. 2 and 3. Specifically, the reference numeral 15 designates a tone arm. One end of the tone arm 15 is pivoted at a casing (not shown) and has a reproducing stylus 16 at its tip. The reproducing stylus 16 engages a recorded groove of the recorded disk 19 placed on a turn table 18 which is pivoted at a center pin 17 fixed to the casing. The tip of the tone arm 15 turns and moves to a position shown by the phantom lines in FIG. 2 due to rotation of the recorded disk 19. The turn table 18 is coupled with a rotating shaft of the driving motor 14 through a belt, and it is driven into rotation by the rotation of the driving motor 14.

On the tone arm 15, there is provided a sound conducting member 20 extending along a locus on which the tip of the tone arm 15 is turned and moved. The sound conducting member 20 is, as shown in FIG. 3, formed in a Y-shape. Both ends of the forked legs are hung on holding shafts 21a and 21b secured on the casing. A free end of the sound conducting member 20 is supported by the tone arm 15 to maintain the sound conducting member 20 substantially horizontal. A speaker diaphragm 22 is directly carried on the free end of the sound conducting member 20. Consequently, the tone arm 15 is sandwiched between the recorded disk 19 and the sound conducting member 20, and in this condition, the reproducing stylus 16 engages the recorded groove of the recorded disk 19. To this end, a leaf spring 23 is provided to press the sound conducting member 20 downwardly to adjust the stylus pressure.

Further, the tone arm 15 is, as shown in FIG. 3, normally urged by a turn spring 24 at the pivot point towards a reproduction starting point on the peripheral portion of the recorded disk 19. Thus, the turning movement of the end of the tone arm 15 caused by the rotation of the turn table 19 is effected against the urging force of the turn spring 24.

When the end of the tone arm 15 reaches a reproducing end point on an inner circular portion of the recorded disk 19 shown by the phantom lines in FIG. 2, the tone arm 15 is designed to be raised upwardly to disengage the reproducing stylus 16 from the recorded groove of the recorded disk 19 as is known in the art. It automatically returns to the reproducing starting point by the turning force of the turn spring 24.

The operation of the embodiment described in the foregoing will be described. Assume that the reproducing stylus 16 of the tone arm 15 engages the recorded groove at the reproducing starting point on the recorded disk 19 in the sound generating device 13, and that the driving motor 14 is in the stopped condition.

Figure 4:
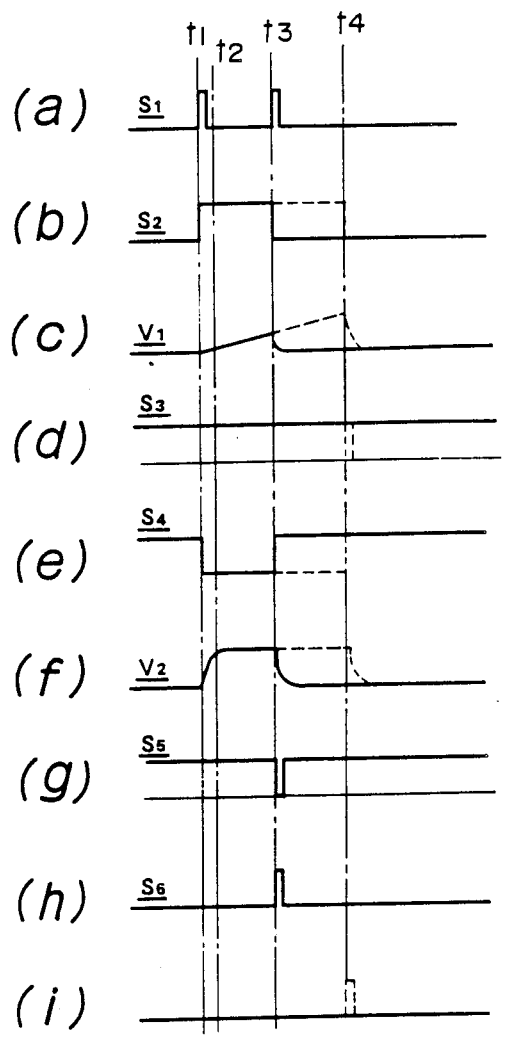
FIG. 4 shows waveforms useful to explain the operation of the present invention.

In this stopped condition, at a time point $t_1$, when a sound is generated by, for example, clapping hands, this sound is detected by the microphone 1. As a result, a differentiated output $S_1$ is obtained from the differentiating circuit 3 as shown in FIG. 4(a). This output is supplied to the set terminal Set of the flip-flop circuit 4 to cause the latter to be in a set condition, and its output signal $S_2$ is inverted to a high level as shown in FIG. 4(b).

Accordingly, the capacitor $C_2$ in the time constant circuit 5 begins charging as shown in FIG. 4(c), and a charged voltage $V_1$ increases gradually. Until the charged voltage $V_1$ reaches a predetermined value, the output of the inverter 5b is maintained at a high level as shown in FIG. 4(d). As a result, the output $S_4$ of the NAND circuit 12 in the drive and control circuit 11 is, as shown in FIG. 4(e), inverted from the high level to a low level at the time point $t_1$ when the flip-flop circuit 4 is set, and the transistor Tr is turned on to cause the driving motor 14 of the sound generating device 13 to be driven into rotation. Consequently, the turn table 18 and the recorded disk 19 are rotated, and a recorded signal including a voice, a melody, or the like recorded beforehand on the recorded groove of the recorded disk 19 is reproduced by the reproducing stylus 16 of the tone arm 15 and transferred to the speaker diaphragm 21 through the sound conducting member 20 to sound the speaker diaphragm 21.

At the time point $t_1$ when the flip-flop circuit 4 is set, the charging capacitor $C_3$ in the reset signal producing circuit 6 begins charging as shown in FIG. 4(f). Its charged voltage $V_2$ becomes a high level at a time point $t_2$ after a predetermined time (far shorter time than the charging time of the capacitor $C_2$ in the time constant circuit 5) elapses. However, at this time point $t_2$, since the output $S_1$ of the differentiating circuit 3 is at a low level, the output $S_5$ of the NAND circuit 9 is maintained at a high level as shown in FIG. 4(g). Since the ouput $S_6$ of the inverter 10 is maintained at a low level as shown in FIG. 4(h), a reset signal is not produced and the generation of sound by the sound generating device 13 is continued.

Further, when a sound is produced again by, for example, clapping the hands at a time point $t_3$ after the time point $t_2$, the differentiated output shown in FIG. 4(a) is outputted from the differentiating circuit 3. Since this output is supplied to the NAND circuit 9 in the reset signal producing circuit 6, the output $S_5$ of the NAND circuit 9 is inverted to a low level as shown in FIG. 4(g). In response to this change, the reset signal $S_6$ obtained from the inverter 10 become a high level, and it is supplied to the reset terminal Res of the flip-flop circuit 4. As a result, the flip-flop circuit 4 is set, and its output $S_2$ is inverted to a low level as shown in FIG. 4(b). The output $S_4$ of the NAND circuit 12 in the drive circuit 11 returns to the high level as shown in FIG. 4(e) to cause the transistor Tr to be turned off, and the supply of the power to the driving motor 14 in the sound generating device 13 is interrupted. Thus, the operation of the sound generating device 13 is stopped.

When this condition is attained, the capacitor $C_2$ in the time constant circuit 5 is discharged, as shown by the solid line in FIG. 4(c). The capacitor $C_3$ in the reset signal producing circuit 6 is dischaged through the NAND circuit 9 as shown in FIG. 4(f), thereby returning to its initial conditions. Accordingly, in this condition, when a sound is generated by clapping the hands, in a similar manner as described above, the sound generating device 13 is operated, and the recorded signal recorded on the recorded groove of the recorded disk 19 is successively reproduced.

When the sound generating device 13 is operated at the first clapping of the hands and its operating condition is maintained as it is, the flip-flop circuit 4 maintains its set condition, and its ouput $S_2$ is also maintained at the high condition as shown in FIG. 4(b). Thus, the charged voltage $V_1$ of the capacitor $C_2$ in the time constant circuit 5 increases as shown by the dotted line in FIG. 4(c). When it reaches a predetermined level at a time point $t_4$, the output $S_3$ of the inverter 5b is inverted from the high level to a low level as shown in FIG. 4(d). As a result, the output $S_4$ of the NAND circuit 12 in the drive and control circuit 11 returns from the low level of the high level as shown by the dotted line in FIG. 4(e), and the transistor Tr is turned off, thereby stopping the operation of the sound generating device 13. Upon stopping the operation of the sound generating device 13, since the output $S_3$ of the time constant circuit 5 is supplied to the inverter 7 in the reset signal producing circuit 6, the output of the inverter 7 is inverted from the low level to a high level as shown in FIG. 4(i). This output is supplied to the reset terminal Res of the flip-flop circuit 4 to return the flip-flop circuit 4 to the reset condition.

As described above, by inputting a sound to the microphone 1 within a fixed time period set by the time constant circuit 5, the operation of the sound generating device 13 can be stopped. Accordingly, the user can operate and stop the sound generating device 13 as he desires.

Although the embodiment is described for the case in which the drive and control circuit 11 is comprised of the NAND circuit 12 and the transistor Tr, the invention is not limited to this design. Alternatively, if the drive and control circuit 11 is inputted with only the output $S_2$ of the flip-flop circuit 4, the NAND circuit 12 may be replaced by an inverter, or the transistor Tr may be changed to an NPN type by omitting the NAND circuit 12.

Further, in the embodiment described above, although the recorded disk 19 is used as the sound generating device, the invention is not limited to this. A sound generating device such as a magnetic reproducing device, a sound synthesizer circuit, or the like may be used.

Further, in the embodiment described above, although the sound generating device is electric equipment driven by the drive and control circuit 11, the invention is not limited to this, and other arbitrary electric equipment may be used. Also, although the microphone 1 is used as a transducer to sense the sound, another type of transducer for converting the light into an electric signal such as a photodiode, a photoconductor, or the like may be used.

What is claimed is:

1. An electric equipment driving circuit comprising:
    a transducer for converting an input signal into an electric output signal;
    a bistable circuit supplied with the output signal of said transducer as a set signal;
    a time constant circuit connected to an output terminal of said bistable circuit for producing an output after a fixed time elapses from a time at which the output of said bistable circuit is caused to be an on condition;
    A reset signal producing circuit supplied with the output of said time constant circuit, the output of said bistable circuit, and the output of said transducer, said reset signal producing circuit producing a reset signal for said bistable circuit when the output of said time constant circuit is obtained, and when both the output of said bistable circuit and the output of said transducer are in an on condition; and
    a drive and control circuit supplied with the output of said bistable circuit for driving and controlling an electric motor in response to output from the bistable circuit.

* * * * *